(12) United States Patent
Adachi et al.

(10) Patent No.: US 8,901,457 B2
(45) Date of Patent: Dec. 2, 2014

(54) HEAT-TRANSFER-MEDIUM HEATING APPARATUS AND VEHICLE AIR CONDITIONING APPARATUS USING THE SAME

(75) Inventors: Tomoyasu Adachi, Tokyo (JP); Nobuya Nakagawa, Tokyo (JP); Shiro Matsubara, Tokyo (JP); Naoto Kunieda, Aichi (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 0 days.

(21) Appl. No.: 13/512,773

(22) PCT Filed: Apr. 5, 2011

(86) PCT No.: PCT/JP2011/058578
§ 371 (c)(1),
(2), (4) Date: Jul. 5, 2012

(87) PCT Pub. No.: WO2011/132523
PCT Pub. Date: Oct. 27, 2011

(65) Prior Publication Data
US 2013/0026151 A1  Jan. 31, 2013

(30) Foreign Application Priority Data

Apr. 19, 2010  (JP) .................................. 2010-095781

(51) Int. Cl.
| | | |
|---|---|---|
| B60L 1/02 | (2006.01) | |
| A47J 31/00 | (2006.01) | |
| B67D 7/80 | (2010.01) | |
| F24H 1/10 | (2006.01) | |
| F24H 1/12 | (2006.01) | |
| B60H 1/22 | (2006.01) | |

(52) U.S. Cl.
CPC .............. B60H 1/2221 (2013.01); F24H 1/121 (2013.01); F24H 2250/04 (2013.01)
USPC ............................ 219/202; 219/208; 392/465

(58) Field of Classification Search
USPC ........... 219/202, 205, 208; 392/465, 485, 478
See application file for complete search history.

(56) References Cited

U.S. PATENT DOCUMENTS

| | | |
|---|---|---|
| 6,093,909 A | 7/2000 | Beetz et al. |
| 6,952,524 B2 | 10/2005 | Bissonnette et al. |

(Continued)

FOREIGN PATENT DOCUMENTS

| | | |
|---|---|---|
| CN | 100567843 C | 12/2009 |
| JP | 2003-101277 A | 4/2003 |

(Continued)

OTHER PUBLICATIONS

International Search Report of PCT/JP2011/058578; mailing date Jul. 5, 2011; with English translation.

(Continued)

*Primary Examiner* — Dana Ross
*Assistant Examiner* — Lindsey C Teaters
(74) *Attorney, Agent, or Firm* — Westerman, Hattori, Daniels & Adrian, LLP

(57) ABSTRACT

Provided is a heat-transfer-medium heating apparatus including: a first heat-transfer-medium circulating box and a second heat-transfer-medium circulating box, which are attached to each other in a fluid-tight manner, in which heat-transfer-medium circulating paths are formed therein in close contact with both surfaces of a PTC heater; an electrical-component cooling wall member that is provided in, for example, the first heat-transfer-medium circulating box so as to be located adjacent to the heat-transfer-medium circulating path; and an electrical component that is fixed on the electrical-component cooling wall member, wherein a protruding portion is formed on the surface at the heat-transfer-medium circulating path side of the electrical-component cooling wall member so as to be positioned at exactly behind an installation position of the electrical component and to extend towards the heat-transfer-medium circulating path.

5 Claims, 8 Drawing Sheets

(56) References Cited

U.S. PATENT DOCUMENTS

| | | | |
|---|---|---|---|
| 2004/0232369 A1* | 11/2004 | Kajitani | 251/122 |
| 2008/0000889 A1 | 1/2008 | Niederer et al. | |
| 2008/0053981 A1 | 3/2008 | Adachi et al. | |
| 2008/0071464 A1* | 3/2008 | Hanai | 701/102 |

FOREIGN PATENT DOCUMENTS

| | | |
|---|---|---|
| JP | 2008-007106 A | 1/2008 |
| JP | 2008-056044 A | 3/2008 |

OTHER PUBLICATIONS

Chinese Office Action dated Jan. 30, 2014, issued in corresponding Chinese application No. 201180004714.4, w/ English translation (16 pages).

Japanese Decision to Grant a Patent dated Apr. 1, 2014, issued in Japanese Patent Application No. 2010-095781, w/ English concise statement of relevance (4 pages).

Notice of Allowance dated Sep. 23, 2014, issued in corresponding Chinese Patent Application No. 201180004714.4, with English concise statement of relevance (3 pages).

\* cited by examiner

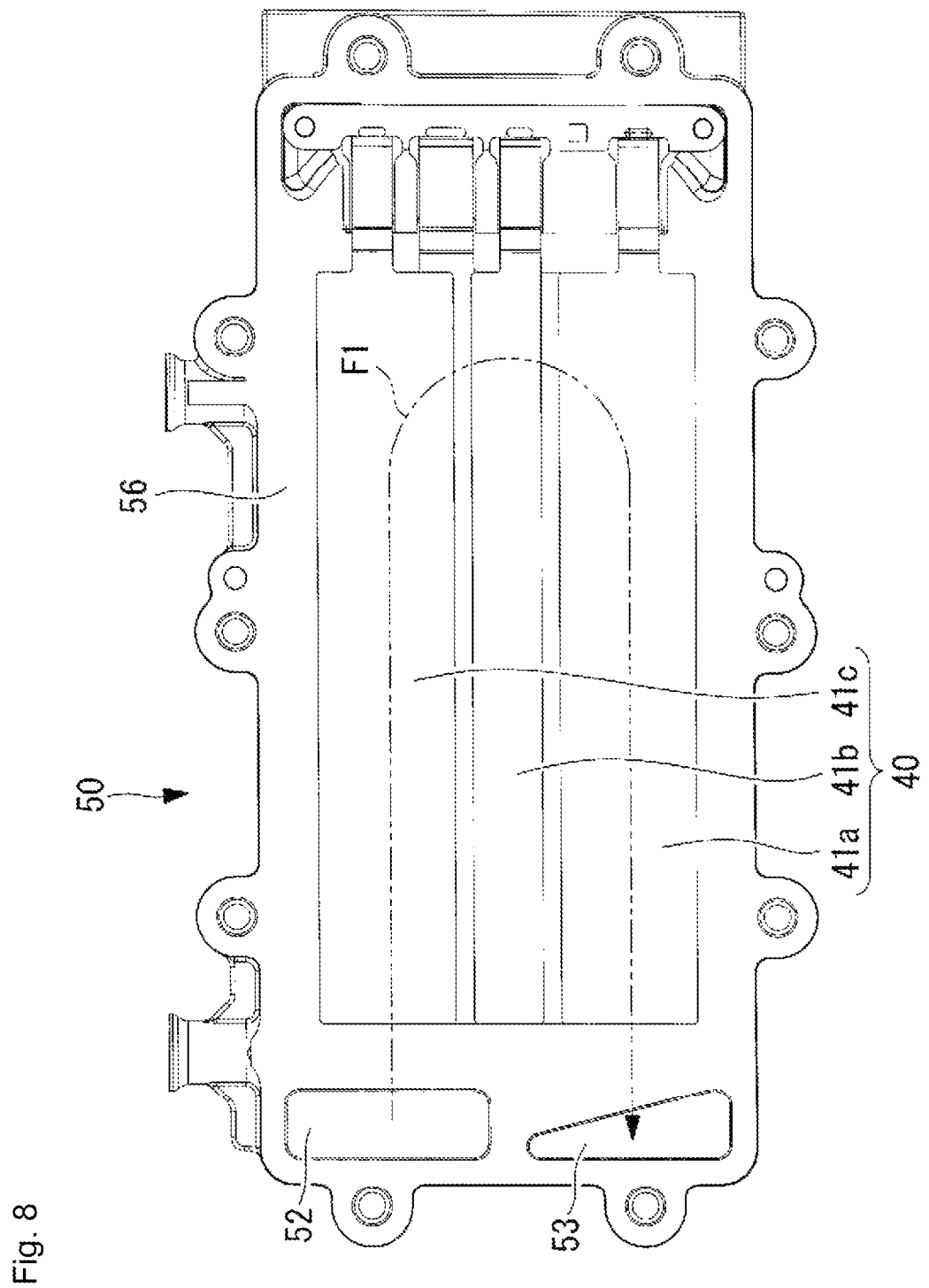

HEAT-TRANSFER-MEDIUM HEATING APPARATUS AND VEHICLE AIR CONDITIONING APPARATUS USING THE SAME

TECHNICAL FIELD

The present invention relates to a heat-transfer-medium heating apparatus for heating a heat transfer medium using a PTC (Positive Temperature Coefficient) heater and to a vehicle air conditioning apparatus using the same.

BACKGROUND ART

One known heat-transfer-medium heating apparatus for heating a heat transfer medium in the related art is an apparatus using a PTC heater, in which a PTC thermistor element (PTC element) is used as a heat-generating element. A PTC heater exhibits a PTC thermistor characteristic in which the resistance increases as the temperature increases, and the temperature rise is moderated as the consumed current is controlled by the temperature rise, after which, the consumed current and the temperature of a heat-generating part reach a saturation region where they are stabilized. The PTC heater thus exhibits a self-controlled temperature property.

As described above, the PTC heater has a property in which the consumed current decreases as the temperature of the heater is increased, and when it reaches a constant temperature saturation region, the consumed current is stabilized at a low value. Utilizing this property, an advantage is afforded in that it is possible to reduce the electrical power consumption and to prevent an abnormal increase in the temperature of the heat-generating part.

Therefore, PTC heaters are used in a wide range of technical fields, and in the field of air conditioning, as disclosed in PTL 1, for example, a heat-transfer-medium heating apparatus in which a PTC heater is used as a heating apparatus for heating a heat transfer medium (in this case, engine coolant) supplied to a radiator, which heats air while an engine is stopped, has been proposed for a hybrid vehicle air-conditioning apparatus.

This heat-transfer-medium heating apparatus includes two heat-transfer-medium circulating boxes connected to each other in a fluid-tight manner, and a plate-shaped PTC heater is interposed between the two heat-transfer-medium circulating boxes so as to be in close contact therewith. A heat-transfer-medium circulating path is formed in each of the heat-transfer-medium circulating boxes so as to be positioned in the vicinity of the PTC heater. Thus, engine coolant flowing therethrough is heated with the PTC heater and circulated in a vehicle air conditioning apparatus to regulate the temperature in a vehicle cabin.

A board accommodating section, which is a separate compartment formed adjacent to the heat-transfer-medium circulating path, is provided in the heat-transfer-medium circulating box, and a control board that controls the PTC heater is installed in the board accommodating section. Heat-generating electrical components, such as IGBTs, FETs, and so forth, to be mounted on this control board are securely fastened with screws etc. to an electrical-component cooling wall member, which is disposed so as to separate the heat-transfer-medium circulating path and the board accommodating section, in a closely contacted manner such that the heat-generating electrical components are cooled by the engine coolant flowing through the heat-transfer-medium circulating path.

CITATION LIST

Patent Literature

PTL 1 Japanese Unexamined Patent Application, Publication No. 2008-56044

SUMMARY OF INVENTION

Technical Problem

Heat-transfer-medium circulating boxes are generally formed of a light weight metal material having good heat conductivity, such as aluminum etc., and an electrical-component cooling wall member on which heat-generating electrical components are installed is formed to have a flat plate shape. In order to reduce the manufacturing cost of the heat-transfer-medium circulating boxes and to reduce their weight, it is desirable to reduce the thickness of respective parts, including the electrical-component cooling wall member.

However, in order to securely fasten the heat-generating electrical components to the electrical-component cooling wall member with screws, the electrical-component cooling wall member needs to have a sufficient thickness for fastening the heat-generating electrical components with screws. This results in excessive thickness of the electrical-component cooling wall member, causing an increase in the weight of the heat-transfer-medium circulating boxes and an increase in the manufacturing cost. Furthermore, the heat generated from the electrical components cannot be dissipated efficiently to the heat-transfer-medium circulating path.

Furthermore, because the surface at the heat-transfer-medium circulating path side of the electrical-component cooling wall member in the related art has a flat plate shape, it also impedes efficient release of the heat generated from the electrical components to the heat-transfer-medium circulating path.

In addition, if the above-mentioned electrical-component cooling wall member is provided with a temperature sensor that determines the temperature of the heat transfer medium flowing in the heat-transfer-medium circulating path, there is a problem that the detection sensitivity of the temperature is lowered due to the large thickness of the electrical-component cooling wall member.

The present invention has been conceived in light of the above-described problems, and an object thereof is to provide a heat-transfer-medium heating apparatus that is capable of achieving a reduction in the weight and manufacturing cost of a heat-transfer-medium heating apparatus by reducing the thickness of an electrical-component cooling wall member on which heat-generating electrical components are installed and that is capable of achieving improvements in performance and reliability by increasing the heat transfer efficiency between the electrical components and the heat transfer medium, and to provide a vehicle air conditioning apparatus using the same.

Solution to Problem

In order to realize the object described above, the present invention provides the following solutions.

Specifically, a heat-transfer-medium heating apparatus according to a first aspect of the present invention is a heat-transfer-medium heating apparatus including a plate-shaped PTC heater; a first heat-transfer-medium circulating box in which a heat-transfer-medium circulating path is formed therein in close contact with one surface of the PTC heater; a second heat-transfer-medium circulating box in which a heat-transfer-medium circulating path is formed therein in close contact with the other surface of the PTC heater and that is attached to the first heat-transfer-medium circulating box in a fluid-tight manner; an electrical-component cooling wall member that is provided in at least one of the first and the second heat-transfer-medium circulating boxes so as to be located adjacent to the heat-transfer-medium circulating path; and an electrical component that controls the PTC heater and is fixed on the electrical-component cooling wall member, the heat-transfer-medium heating apparatus being configured to be capable of heating a heat transfer medium flowing through the heat-transfer-medium circulating path in the first and the second heat-transfer-medium circulating boxes with heat radiated from both surfaces of the PTC heater and of exchanging heat between the heat transfer medium and the electrical component, wherein a protruding portion that is positioned exactly behind an installation position of the electrical component and extending towards the heat-transfer-medium circulating path is formed on the surface at the heat-transfer-medium circulating path side of the electrical-component cooling wall member.

According to this heat-transfer-medium heating apparatus, by providing the protruding portion, the surface area of a portion of the electrical-component cooling wall member located exactly behind the portion where a heat-generating electrical component is installed is increased to allow the heat transfer medium to contact the portion where the electrical component is installed over a greater surface area, thereby improving the heat transfer efficiency between electrical component and the heat transfer medium. For example, if it is the electrical component that generates heat, it is possible to efficiently cool the electrical component with a heat transfer medium to improve the performance and the reliability of the heat-transfer-medium heating apparatus.

In a heat-transfer-medium heating apparatus according to a first aspect of the present invention, the protruding portion may also function as a fastening boss of a fastening member that fastens the electrical component to the electrical-component cooling wall member.

According to the above-described configuration, because the fastening member that fastens the electrical component can be fastened using the protruding portion as the fastening boss, even if the thickness of the electrical-component cooling wall member is small, it is possible to secure sufficient length of engagement of the fastening member to achieve reliable fastening of the electrical component to the electrical-component cooling wall member, reducing the weight and the manufacturing cost of the heat-transfer-medium circulating box.

In addition, in a heat-transfer-medium heating apparatus according to a first aspect of the present invention, the electrical component may be a temperature sensor for a heat transfer medium that flows through the heat-transfer-medium circulating path, and the protruding portion may extend towards the center of flow of the heat transfer medium.

According to the above-described configuration, by providing the protruding portion, the surface area of the surface at the heat-transfer-medium circulating path side of the portion of the electrical-component cooling wall member on which the temperature sensor is installed is increased. Therefore, the heat transfer efficiency between the temperature sensor and the heat transfer medium is improved, and the temperature detection sensitivity of the temperature sensor is improved to improve its performance.

In addition, in a heat-transfer-medium heating apparatus according to a first aspect of the present invention, an inclined portion that directs flow of the heat transfer medium towards the protruding portion may be formed in the heat-transfer-medium circulating path.

According to the above-described configuration, because the heat transfer medium flowing through the heat-transfer-medium circulating path is directed towards the protruding portion by the inclined portion, it is possible to improve the temperature detection sensitivity of the temperature sensor by preventing the heat transfer medium from stagnating in the vicinity of the protruding portion, thus facilitating heat exchange between the temperature sensor and the heat transfer medium.

Furthermore, a vehicle air conditioning apparatus according to a second aspect of the present invention is a vehicle air conditioning apparatus including a blower that circulates outside air or vehicle cabin air; a cooler provided at the downstream side of the blower; and a radiator provided at the downstream side of the cooler, wherein the radiator is configured such that a heat transfer medium heated with a heat-transfer-medium heating apparatus according to any of the first to fourth aspects can be circulated.

With such a configuration, it is possible to reduce the weight and the manufacturing cost of the heat-transfer-medium heating apparatus, and in turn, it is possible to achieve cost reduction of the vehicle air conditioning apparatus and improvements in the performance and the reliability of the vehicle air conditioning apparatus.

Advantageous Effects of Invention

As described above, with a heat-transfer-medium heating apparatus according to the present invention and a vehicle air conditioning apparatus using the same, the thickness of an electrical-component cooling wall member onto which a heat-generating electrical component is installed is reduced in the heat-transfer-medium heating apparatus; therefore, it is possible to achieve a reduction in the weight and manufacturing cost of the heat-transfer-medium heating apparatus, to improve the heat transfer efficiency between the electrical component and the heat transfer medium, and to improve performance and reliability of the heat-transfer-medium heating apparatus and the vehicle air conditioning apparatus.

BRIEF DESCRIPTION OF DRAWINGS

FIG. 8 is a top view of a lower heat-transfer-medium circulating box shown in FIG. 4 taken along arrows VIII-VIII.

DESCRIPTION OF EMBODIMENTS

An embodiment of the present invention will be described below with reference to FIGS. 1 to 8.

Figure 1:
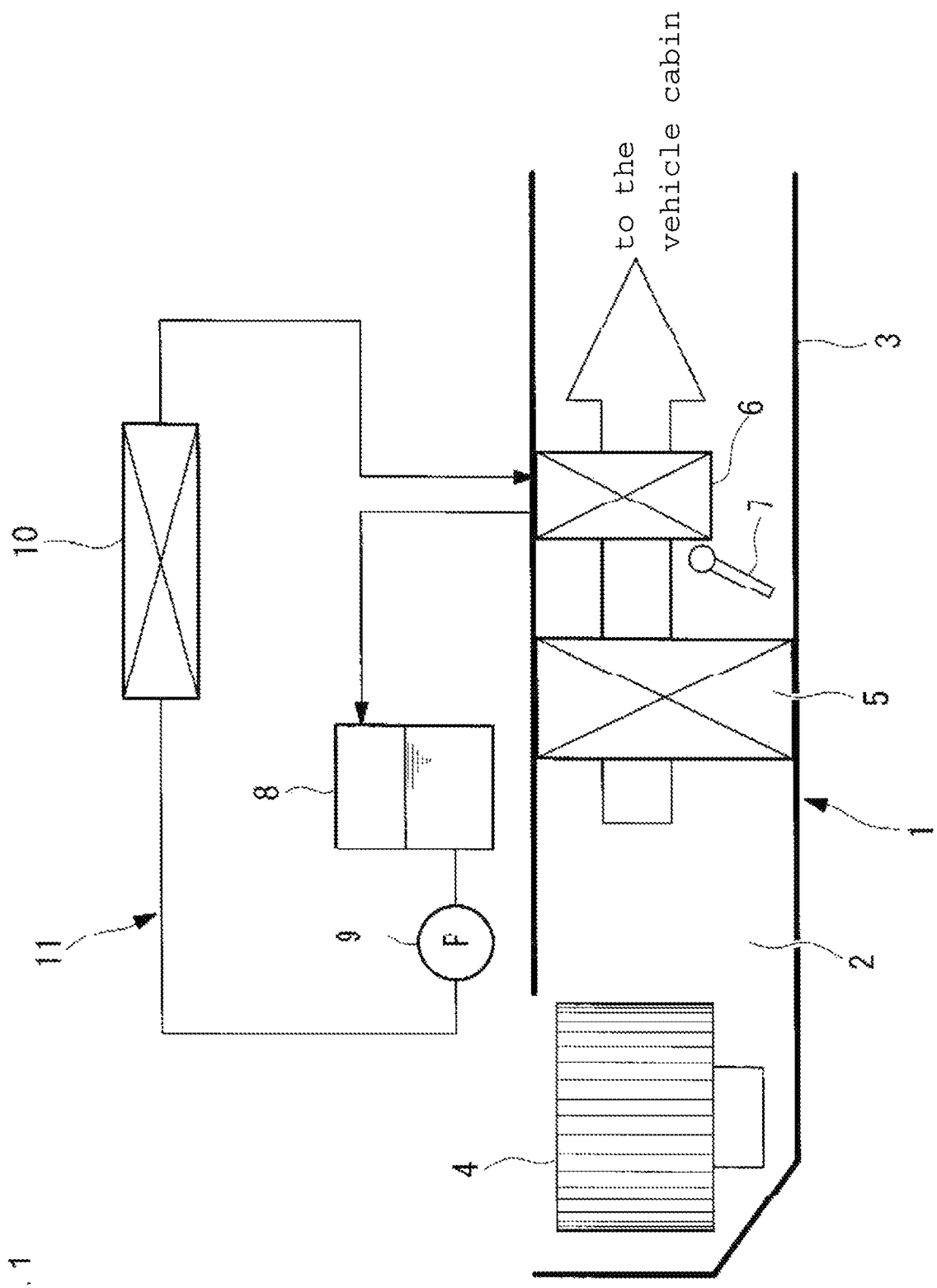
FIG. 1 is a diagram showing, in outline, the configuration of a vehicle air conditioning apparatus according to an embodiment of the present invention.

FIG. 1 shows, in outline, a configuration diagram of a vehicle air conditioning apparatus 1 according to this embodiment. The vehicle air conditioning apparatus 1 is a hybrid vehicle air conditioning apparatus, for example, and is provided with a casing 3 that forms an air duct 2 for taking in outside air or vehicle cabin air, performing air conditioning, and guiding the conditioned air to the vehicle cabin.

A blower 4 that sucks in and pressurizes outside air or vehicle cabin air and supplies the air under pressure towards the downstream side, a cooler 5 that cools the air supplied by the blower 4, a radiator 6 that heats the air cooled after passing through the cooler 5, and an air-mix damper 7 that adjusts the ratio of the volume of air passing through the radiator 6 and the volume of air bypassing the radiator 6 to regulate the temperature of the air mixed at the downstream side thereof are provided inside the casing 3, in this order from the upstream side to the downstream side of the air duct 2.

The downstream side of the casing 3 is connected to a plurality of vents (not shown) for blowing out the temperature-regulated air into the vehicle cabin via a blowing mode switching damper and duct (not shown). The cooler 5 forms a refrigerant circuit together with a compressor, a condenser, and an expansion valve, which are not shown in the drawing, and cools the air passing therethrough by evaporating a refrigerant which is adiabatically expanded at the expansion valve.

The radiator 6 forms a heat-transfer-medium circulating circuit 11 together with a tank 8, a pump 9, an engine (not shown), and a heat-transfer-medium heating apparatus 10 according to the present invention. An engine coolant of a hybrid vehicle is used as a heat transfer medium that flows in the heat-transfer-medium circulating circuit 11. The heat-transfer-medium circulating circuit 11 warms the air passing through the radiator 6 in the casing 3 by heating the engine coolant with the heat-transfer-medium heating apparatus 10 in a hybrid-driving mode etc. during which the temperature of the engine coolant, which is a heat transfer medium, is scarcely increased and by circulating the heated engine coolant through the heat-transfer-medium circulating circuit 11 with the pump 9.

Figure 2:
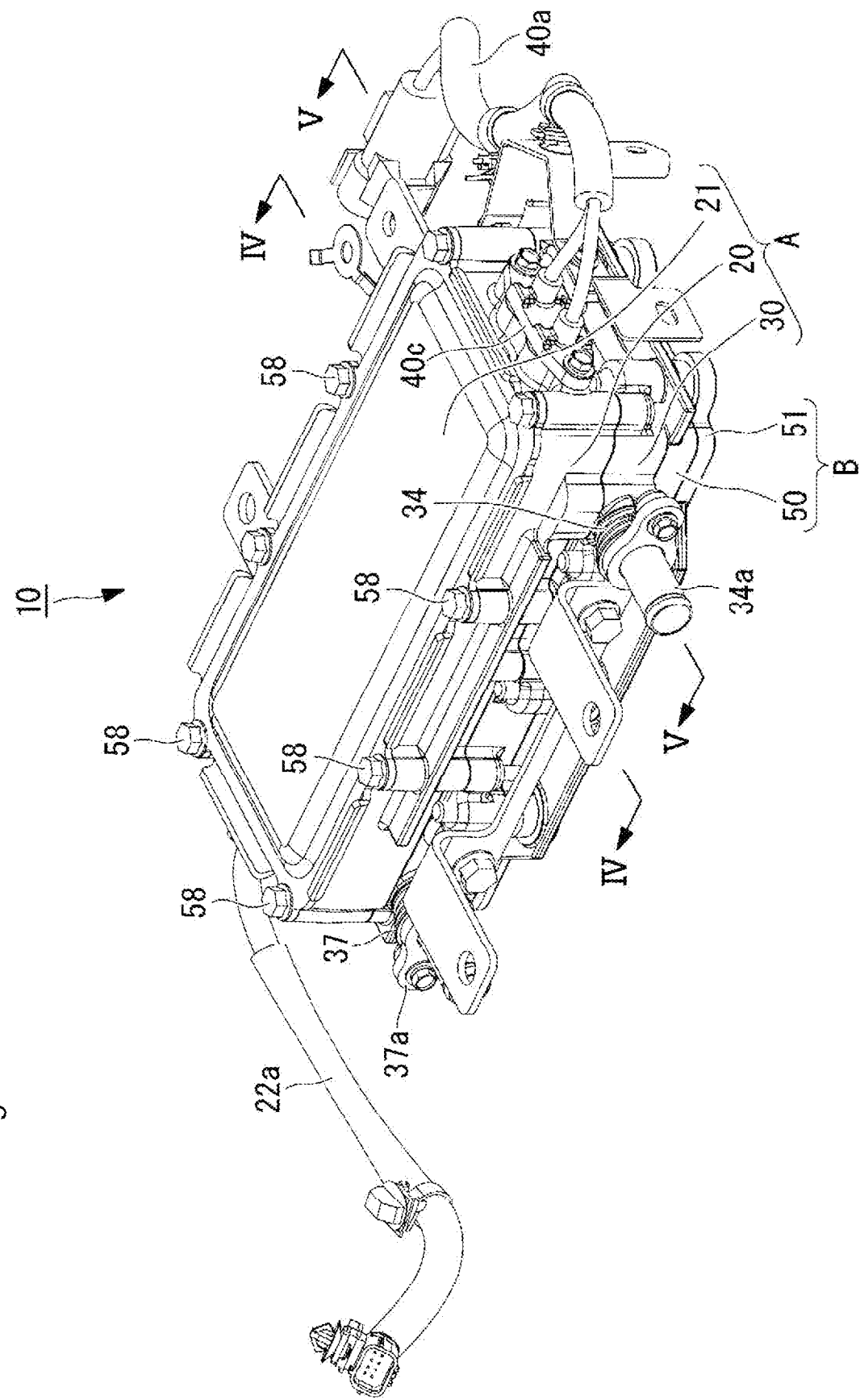
FIG. 2 is a perspective view of a heat-transfer-medium heating apparatus according to an embodiment of the present invention.
Figure 3:
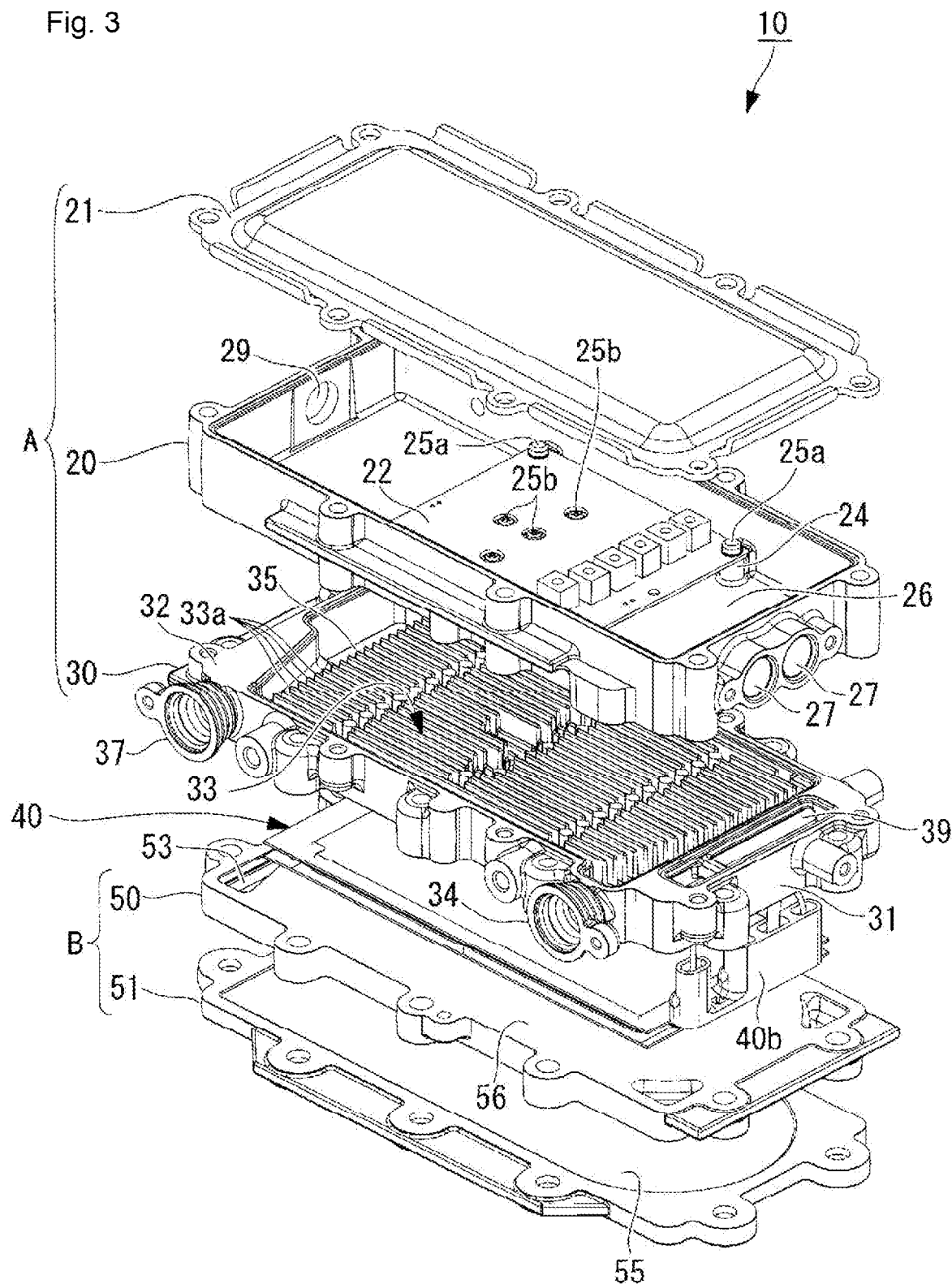
FIG. 3 is an exploded perspective view of a heat-transfer-medium heating apparatus according to an embodiment of the present invention.
Figure 4:
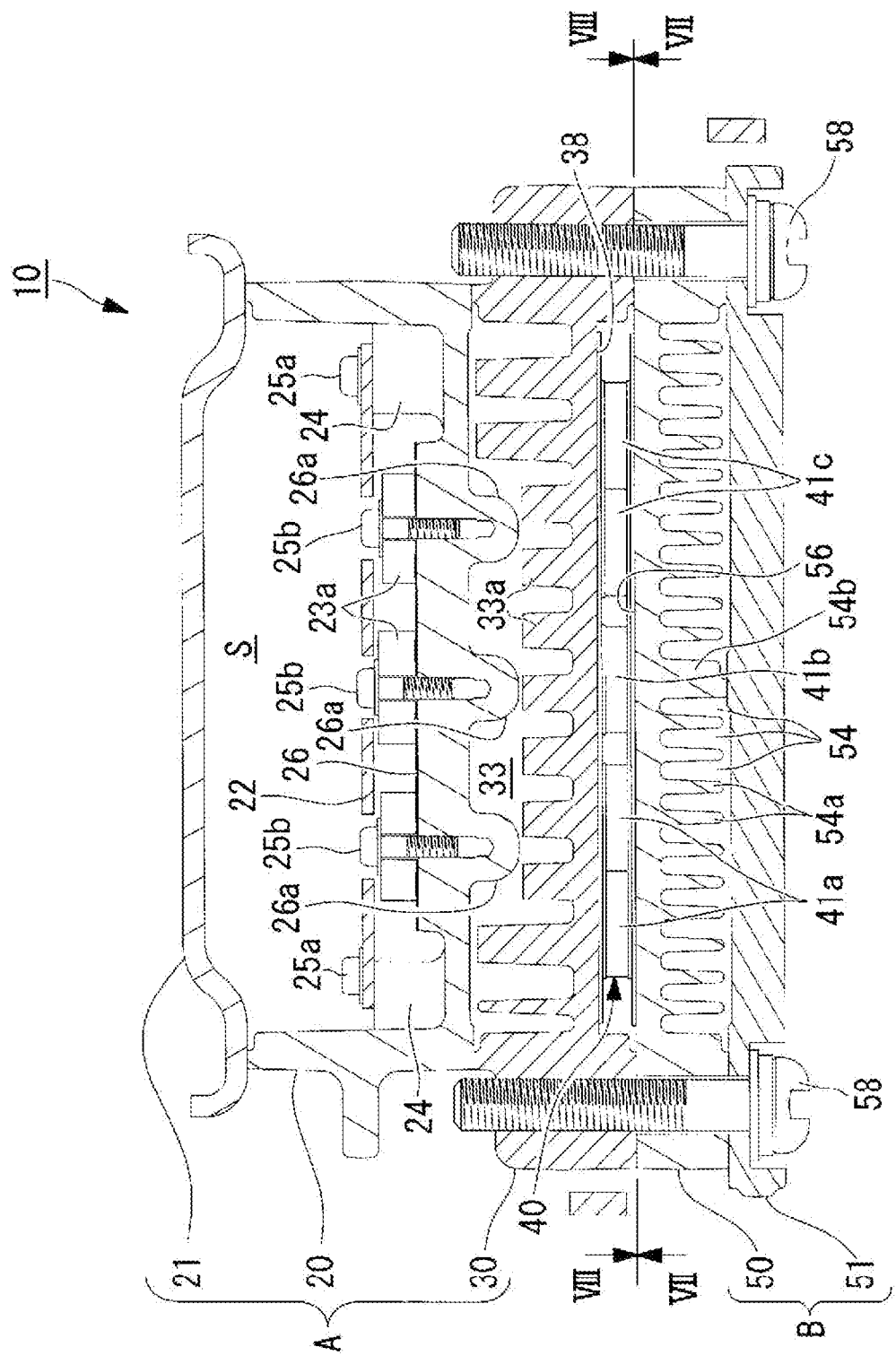
FIG. 4 is a longitudinal sectional view taken along a line IV-IV in FIG. 2.
Figure 5:
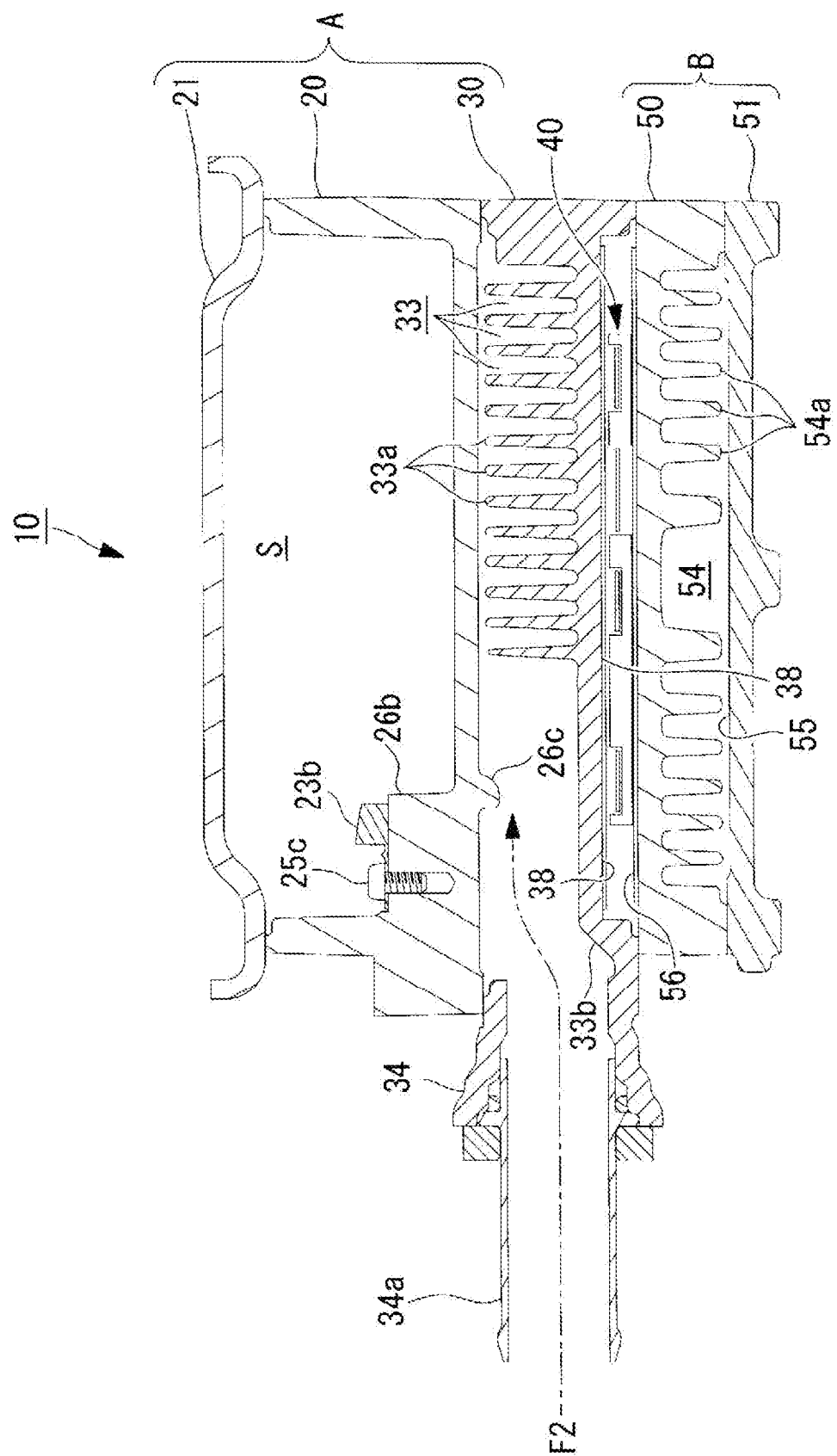
FIG. 5 is a longitudinal sectional view taken along a line V-V in FIG. 2.

FIG. 2 shows a perspective view of the heat-transfer-medium heating apparatus 10, FIG. 3 shows an exploded perspective view of the heat-transfer-medium heating apparatus 10, and FIGS. 4 and 5 show longitudinal sectional views of the heat-transfer-medium heating apparatus 10.

This heat-transfer-medium heating apparatus 10 is provided with a first heat-transfer-medium circulating box A that is configured in a box shape by stacking a plurality of box-constituting members 20, 21, and 30, a second heat-transfer-medium circulating box B that is configured, in a similar way, in a box shape by stacking a plurality of box-constituting members 50 and 51 and that is attached to the lower surface of the first heat-transfer-medium circulating box A in a fluid-tight manner, and a PTC heater 40 that is interposed between these first and second heat-transfer-medium circulating boxes A and B.

The first heat-transfer-medium circulating box A is formed by attaching, in a fluid-tight manner, a rectangular board-accommodating box 20, on the upper surface of which a cover 21 is attached, and an upper heat-transfer-medium circulating box 30 having the same rectangular shape as that of the board-accommodating box 20. In addition, the second heat-transfer-medium circulating box B is provided with a lower heat-transfer-medium circulating box 50 having the same rectangular shape as that of the upper heat-transfer-medium circulating box 30 and a cover 51 that is attached to the lower surface of the lower heat-transfer-medium circulating box 50 in a fluid-tight manner. As shown in FIGS. 2 and 4, a plurality of bolts 58 are used to fasten together the first heat-transfer-medium circulating box A and the second heat-transfer-medium circulating box B, and each of the other box-constituting members 20, 21, 30, 50, and 51.

The PTC heater 40 has a rectangular plate-shape that is smaller than the upper heat-transfer-medium circulating box 30 and the lower heat-transfer-medium circulating box 50, and, as described later, the PTC heater 40 is arranged such that the upper surface of the PTC heater 40 is in close contact with a flat heat dissipation surface 38 formed on the lower surface of the upper heat-transfer-medium circulating box 30 and the lower surface of the PTC heater 40 is in close contact with a flat heat dissipation surface 56 formed on the upper surface of the lower heat-transfer-medium circulating box 50.

The board-accommodating box 20 is a rectangular open box, which is formed of a heat conducting material, such as aluminum alloy, whose upper surface is sealed with the cover 21, and whose interior space defines a board accommodating section S in which a control board 22 (see FIGS. 3 and 4) that controls the PTC heater 40 is accommodated and installed. Heat-generating electrical components 23a, such as IGBTs (Insulated Gate Bipolar Transistors), FETs (Field effect transistors), and so forth, and control circuits are integrated on the control board 22, and a high voltage of 300 V for driving the PTC heater 40 and a low voltage of 12 V for control are supplied to the control board 22.

The control board 22 is fixedly installed on supports 24 protruding from the bottom surface of the board-accommodating box 20 by being fastened thereto with screws 25a at the four corners. In addition, the heat-generating electrical components 23a are arranged on the lower surface of the control board 22 and are securely fastened with fastening members, such as screws 25b etc., such that, for example, the heat-generating electrical components 23a are in contact with the upper surface of an electrical-component cooling wall member 26 disposed on the bottom surface of the board-accommodating box 20 with an insulating layer (not shown) disposed therebetween. In order to increase a cooling effect for the heat generated by the electrical components 23a, the electrical components 23a and the electrical-component cooling wall member 26 are arranged in the vicinity of the inlet side of a heat-transfer-medium circulating path (circulating channels 33), which will be described later, disposed in the upper heat-transfer-medium circulating box 30.

Wiring through-holes 27 are formed in one end surface of the board-accommodating box 20 (see FIGS. 3 and 6), and a wiring member 40a (see FIG. 2) connected to the control board 22 is inserted therein. In addition, a harness through-hole 29 (see FIG. 3) is formed on the other end surface of the board-accommodating box 20, and an electrical harness 22a (see FIG. 2) connected to the control board 22 is inserted therein.

FIGS. 3 to 5 and FIG. 7 show the heat-transfer-medium circulating path in the upper heat-transfer-medium circulating box 30. The upper heat-transfer-medium circulating box 30 is a rectangular open box formed of a heat conducting material, such as aluminum alloy etc., and is provided with, at the upper surface thereof, an inlet header 31 and an outlet header 32, forming a pair at both ends, and the parallel groove-shaped circulating channels 33 that are formed between the inlet header 31 and the outlet header 32 and separated by numerous fins 33a. The inlet header 31, the outlet header 32, and the upper surface of the circulating channels 33 are closed off with the bottom surface of the board-accommodating box 20 in a fluid-tight manner (see FIGS. 4 and 5).

With this configuration, flow paths for the engine coolant are formed between the board-accommodating box 20 and the upper heat-transfer-medium circulating box 30, wherein the engine coolant flowing through the inlet header 31 is split into numerous circulating channels 33 and simultaneously flows through the circulating channels 33 towards the outlet header 32. The engine coolant flowing through the circulating channels 33 then flows into a flow through-hole 35 formed on the lower surface of the upper heat-transfer-medium circulating box 30 (see FIGS. 3 and 7), which will be described later, without flowing into the outlet header 32 directly.

Figure 7:
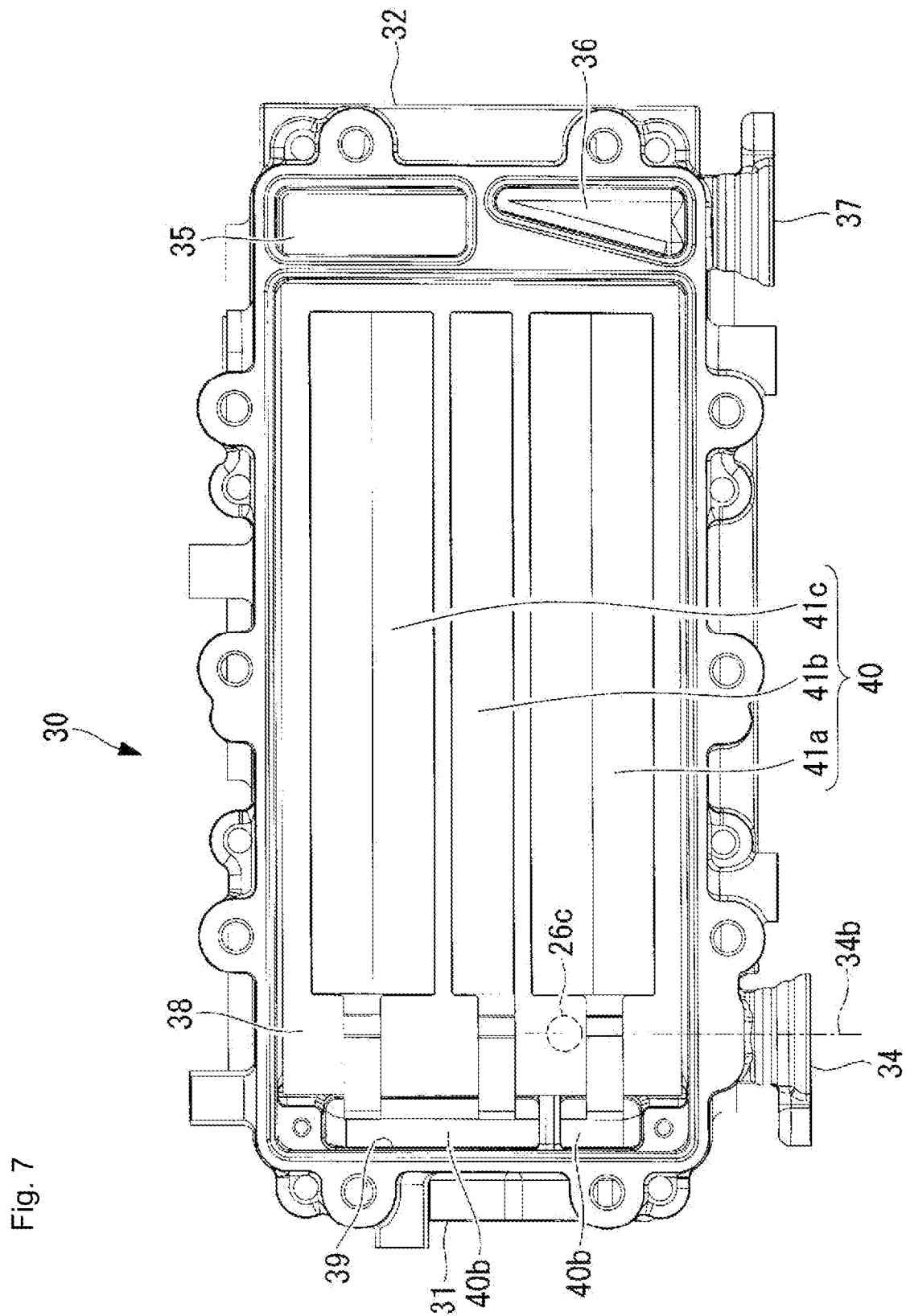
FIG. 7 is a bottom view of an upper heat-transfer-medium circulating box shown in FIG. 4 taken along arrows VII-VII.

In addition, a large recessed portion having the flat heat dissipation surface 38, which is in close contact with the upper surface of the PTC heater 40, as the top surface is provided at the lower surface of the upper heat-transfer-medium circulating box 30 (see FIGS. 4, 5, and 7). This recessed portion is located at the opposite side from the circulating channels 33 through which the engine coolant flows and is formed such that the PTC heater 40 is fitted therein. A wiring through-hole 39 (see FIG. 3) is formed so as to penetrate the end portion opposite to the flow through-holes 35 and 36 on the upper surface of the upper heat-transfer-medium circulating box 30, and this wiring through-hole 39 is aligned with a wiring through-hole 28 of the board-accommodating box 20.

FIGS. 3 to 5 and 8 show the heat-transfer-medium circulating path in the lower heat-transfer-medium circulating box 50. The lower heat-transfer-medium circulating box 50 is a rectangular open box formed of a heat conducting material, such as aluminum alloy etc., and is provided with, at one end thereof, communicating holes 52 and 53 (see FIG. 8). These communicating holes 52 and 53 are aligned with the flow through-holes 35 and 36 of the upper heat-transfer-medium circulating box 30, respectively.

In addition, parallel groove-shaped circulating channels 54 that are separated by numerous fins 54a (see FIG. 4) are formed at the lower surface of the lower heat-transfer-medium circulating box 50 so as to extend from the communicating hole 52 to the other side, turn around at the other end, and reach the communicating hole 53. The outgoing path and the return path of the U-shaped circulating channels 54 are partitioned by a barrier 54b that is taller than the fins 54a (see FIG. 4). The lower surface of the circulating channels 54 is closed off with the cover 51, as mentioned above, and the cover 51 is provided with a U-shaped shallow recessed portion 55 (see FIG. 3) that matches with the shapes of the circulating channels 54 and the barrier 54b.

With this configuration, a flow path for the heat transfer medium is formed between the lower heat-transfer-medium circulating box 50 and the cover 51, wherein the engine coolant flowing into the communicating hole 52 is split into numerous circulating channels 54 from the communicating hole 52, simultaneously flows through the respective circulating channels 54, turns around at the other end, and reaches the communicating hole 53.

The communicating hole 52 of the lower heat-transfer-medium circulating box 50 communicates with the flow through-hole 35 provided in the outlet header 32 of the upper heat-transfer-medium circulating box 30, thereby causing the engine coolant, which has flown through the circulating channels 33 of the upper heat-transfer-medium circulating box 30, to flow thereinto. In addition, the communicating hole 53 of the lower heat-transfer-medium circulating box 50 communicates with the flow through-hole 36 provided in the outlet header 32 of the upper heat-transfer-medium circulating box 30 to form a path for discharging the engine coolant, which has flown through the lower heat-transfer-medium circulating box 50, to the outside from the flow through-hole 36 via an outlet portion 37.

The upper surface of the lower heat-transfer-medium circulating box 50 defines the heat dissipation surface 56 (see FIGS. 3 to 5, and 8), and by sandwiching the PTC heater 40 between the heat dissipation surface 56 and the flat heat dissipation surface 38 at the lower surface of the upper heat-transfer-medium circulating box 30, the heat dissipation surfaces 38 and 56 are pressed in contact with compressible heat conducting layers (not shown) attached to both sides of the PTC heater 40.

FIGS. 3, 4, 7, and 8 show the configuration of the PTC heater 40. The PTC heater 40 is configured to have a rectangular shape as a whole. The PTC heater 40 is provided with PTC elements 41a, 41b, and 41c, which are heat-generating elements, arranged in three lines, for example, along the flow direction in the heat-transfer-medium circulating path (the circulating channels 33 and the circulating channels 54). These three PTC elements 41a, 41b, and 41c have laminated structures formed by laminating an electrode plate, a non-compressible insulating layer, and a compressible heat conducting layer (not shown) in this order. Each of these PTC elements 41a, 41b, and 41c is configured so as to be capable of individual on/off control with the control circuit integrated on the control board 22.

As shown in FIGS. 4 and 5, the PTC heater 40 can radiate heat from both surfaces thereof to the engine coolant flowing in the upper heat-transfer-medium circulating box 30 and the lower heat-transfer-medium circulating box 50, which are disposed in close contact with the two surfaces of the PTC heater 40, thereby heating the engine coolant.

A wiring member 40b is provided at one end of the PTC heater 40, and this wiring member 40b is bent upwards perpendicularly to the planar direction of the PTC heater 40 and is inserted into the wiring through-hole 39 of the upper heat-transfer-medium circulating box 30 and a wiring through-hole 28 of the board-accommodating box 20. The wiring member 40b is guided to the control board 22 such that, as described above, the cable-shaped wiring member 40a (see FIG. 2) is led out to the outside from the control board 22 through the wiring through-holes 27 of the board-accommodating box 20. A water- and dust-proofed wiring cap 40c is attached to the wiring through-holes 27.

The heat-transfer-medium circulating circuit 11 is connected to an inlet portion 34 of the upper heat-transfer-medium circulating box 30. Low-temperature engine coolant pumped from the pump 9 flows into the inlet header 31 from the inlet portion 34 and is split into the respective circulating channels 33 (see FIG. 3). After the engine coolant flowing through the respective circulating channels 33 towards the outlet header 32 is heated with the PTC heater 40, increasing the temperature thereof, the engine coolant flows are combined just before reaching the outlet header 32 and flow into the communicating hole 52 of the lower heat-transfer-medium circulating box 50 via the flow through-hole 35.

The engine coolant is then split into the respective circulating channels 54 from the communicating hole 52, flows along an imaginary line F1 in FIG. 8, turns around at the other end while being heated again with the PTC heater 40, enters the outlet header 32 from the communicating hole 53 via the flow through-hole 36 of the upper heat-transfer-medium circulating box 30, and returns to the heat-transfer-medium circulating circuit 11 via the outlet portion 37. Accordingly, the engine coolant passing through the inside of the heat-transfer-medium heating apparatus 10 circulates through the heat-transfer-medium circulating circuit 11 while flowing along the two surfaces of the PTC heater 40 and while being heated with the heat from the PTC heater 40, thereby achieving air conditioning of the interior of the vehicle cabin.

Because the PTC elements 41a, 41b, and 41c constituting the PTC heater 40 are configured so as to be individually on/off controllable by the control circuit integrated on the control board 22, the heating capacity can be controlled by individually turning on/off the respective PTC elements 41a, 41b, and 41c with the control board 22 in accordance with the difference between the actual temperature of the engine coolant flowing into the heat-transfer-medium heating apparatus 10 and the required temperature (target temperature). By doing so, it is possible to discharge the engine coolant after heating it to a predetermined temperature.

Next, relevant parts of the present invention will be described.

As described above with reference to FIG. 4, the control board 22 is installed in the board accommodating section S defined in the board-accommodating box 20, and the heat-generating electrical components 23a mounted on the lower surface of the control board 22 are securely fastened with the screws 25b so as to be in contact with the upper surface of the electrical-component cooling wall member 26 disposed on the bottom surface of the board-accommodating box 20. Because the electrical-component cooling wall member 26 is disposed in the vicinity of the inlet of the circulating channels 33 of the upper heat-transfer-medium circulating box 30, heat is exchanged between the electrical components 23a and the engine coolant that has not been heated with the PTC heater 40 to cool the electrical components 23a.

Figure 6:
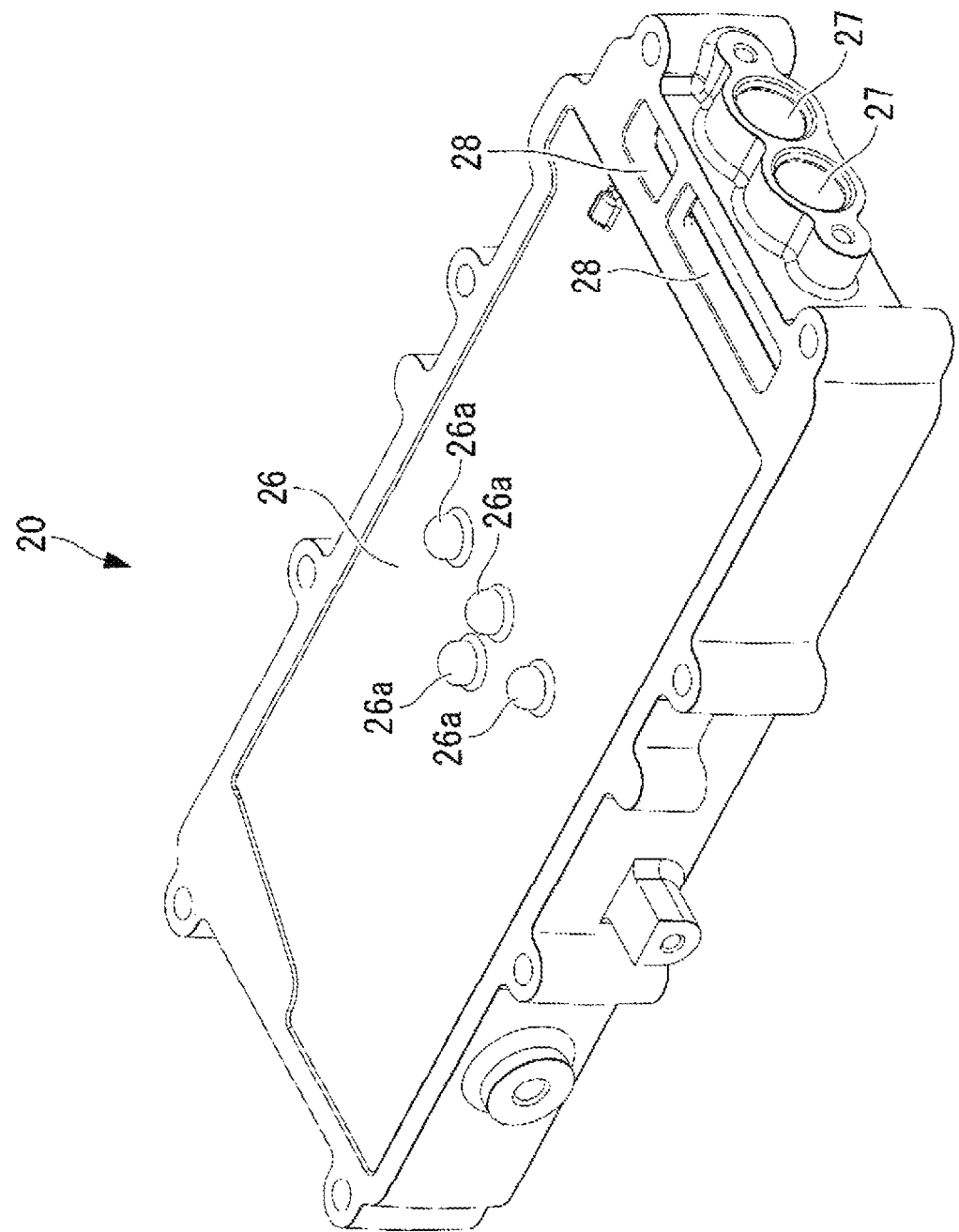
FIG. 6 is a perspective view of a board-accommodating box shown in FIG. 3, which has been turned upside down.

As shown in FIGS. 4 and 6, on the surface at the circulating channels 33 side of the electrical-component cooling wall member 26, hemispherical protruding portions 26a that are located exactly behind (exactly below) the installation positions of the electrical components 23a and that extend towards the circulating channels 33 are formed. These protruding portions 26a also function as fastening bosses of the screws 25b, which are fastening members for fastening the electrical components 23a to the electrical-component cooling wall member 26.

By providing these protruding portions 26a, the surface area of portions exactly behind the electrical-component cooling wall member 26 where the electrical components 23a are installed is increased to allow the engine coolant to contact these portions over greater surface area, thereby improving the heat transfer efficiency between the electrical components 23a and the engine coolant. Therefore, it is possible to efficiently cool the heat-generating electrical components 23a with the engine coolant and to improve the performance and the reliability of the heat-transfer-medium heating apparatus 10.

In addition, as shown in FIG. 4, because the protruding portions 26a also function as the fastening bosses of the screws 25b for fastening the electrical components 23a, it is possible to make the thickness of the electrical-component cooling wall member 26 smaller than the length of female threaded portions for fastening the screws 25b. Accordingly, regardless of the small thickness of the electrical-component cooling wall member 26, it is possible to make the length of the screw 25b sufficiently longer to reliably fasten the electrical components 23a to the electrical-component cooling wall member 26. Therefore, it is possible to achieve a reduction in the weight of the first heat-transfer-medium circulating box A (the upper heat-transfer-medium circulating box 30), and in turn, the overall weight of the heat-transfer-medium heating apparatus 10, and to reduce the manufacturing cost.

On the other hand, as shown in FIG. 5, a temperature sensor 23b is installed in the vicinity of one end of the board accommodating section S. This temperature sensor 23b detects the temperature of the engine coolant by exchanging heat with the engine coolant, which has just been supplied through the inlet portion 34 but not been heated by the PTC heater 40, and is fastened with a screw 25c to a fastening boss 26b, which is formed so as to protrude upward from the bottom surface of the board accommodating section S.

A protruding portion 26c is formed so as to be positioned exactly behind (exactly below) the temperature sensor 23b and to extend towards the circulating channels 33. As shown in FIG. 7, this protruding portion 26c is formed so as to be arranged exactly above an axial extended line 34b of the inlet portion 34 in plan view and to extend towards the center of the flow of the engine coolant flowing into the circulating channels 33 through the inlet portion 34.

Furthermore, an inclined portion 33b is formed at the bottom part of the heat-transfer-medium circulating path in the inlet portion 34 (see FIG. 5). This inclined portion 33b is angled at about 45 degrees in side view and directs the engine coolant flowing from the inlet portion 34 towards the protruding portion 26c, as indicated with an imaginary line F2.

According to the above-described configuration, by providing the protruding portion 26c, the surface area of the surface at the circulating channels 33 side of the portion of the electrical-component cooling wall member 26 on which the temperature sensor 23b is installed is increased. Therefore, the heat transfer efficiency between the temperature sensor 23b and the engine coolant is improved, and the temperature detection sensitivity of the temperature sensor 23b is improved to improve its performance.

In addition, because the engine coolant flowing from the inlet portion 34 is directed toward the protruding portion 26c by forming the inclined portion 33b, it is possible to improve the temperature detection sensitivity of the temperature sensor 23b by preventing the engine coolant from stagnating in the vicinity of the protruding portion 26c, thus facilitating heat exchange between the temperature sensor 23b and the engine coolant.

In addition, the vehicle air conditioning apparatus 1 according to the present invention is configured so as to be provided with the blower 4 for circulating outside air or vehicle cabin air, the cooler 5 that is disposed at the downstream side of the blower 4, and the radiator 6 that is disposed at the downstream side of the cooler 5, so that the engine coolant that is heated with the heat-transfer-medium heating apparatus 10 according to the present invention is circulated through the radiator 6; therefore, it is possible to reduce the weight of the heat-transfer-medium heating apparatus 10 and the manufacturing cost thereof, and in turn, to achieve a cost reduction of the vehicle air conditioning apparatus 1 and improved performance and reliability.

The example in which a heat-transfer-medium heating apparatus is used in a vehicle air conditioning apparatus in this embodiment has been described; however, it is conceivable to apply the heat-transfer-medium heating apparatus according to the present invention to an air conditioning apparatus other than that for a vehicle, as well as to a heating apparatus, a refrigerating apparatus, and so forth.

REFERENCE SIGNS LIST 1 vehicle air conditioning apparatus
4 blower
5 cooler
6 radiator 10 heat-transfer-medium heating apparatus
23a electrical component
23b temperature sensor
25b, 25c fastening member
26 electrical-component cooling wall member
26a, 26c protruding portion
26b fastening boss
33 circulating channel forming heat-transfer-medium circulating path
33b inclined portion
40 PTC heater
A first heat-transfer-medium circulating box
B second heat-transfer-medium circulating box
S board accommodating section

The invention claimed is:

1. A heat-transfer-medium heating apparatus comprising:
a plate-shaped PTC heater;
a first heat-transfer-medium circulating box in which a heat-transfer-medium circulating path is formed therein in close contact with a first surface of the PTC heater;
a second heat-transfer-medium circulating box in which the heat-transfer-medium circulating path is formed therein in close contact with a second surface of the PTC heater and that is attached to the first heat-transfer-medium circulating box in a fluid-tight manner;
an electrical-component cooling wall member that is provided in at least one of the first and the second heat-transfer-medium circulating boxes so as to be located adjacent to the heat-transfer-medium circulating path;
an electrical component that controls the PTC heater is secured to the electrical-component cooling wall member; and
a protruding portion positioned behind an installation position of the electrical component and extending towards the heat-transfer-medium circulating path, wherein
the heat-transfer-medium heating apparatus is configured to heat a heat transfer medium flowing through the heat-transfer-medium circulating path with heat radiated from both surfaces of the PTC heater and to exchange heat between the heat transfer medium and the electrical component,
said protruding portion is formed in a hemispherical shape on a surface of the electrical-component cooling wall member facing the heat-transfer-medium circulating path side, and
only behind the installation position of the electrical component.

2. The heat-transfer-medium heating apparatus according to claim 1, wherein the protruding portion functions as a fastening boss of a fastening member that fastens the electrical component to the electrical-component cooling wall member.

3. The heat-transfer-medium heating apparatus according to claim 1, wherein the electrical component is a temperature sensor for a heat transfer medium that flows through the heat-transfer-medium circulating path, and the protruding portion extends towards a center of flow of the heat transfer medium.

4. The heat-transfer-medium heating apparatus according to claim 3, wherein an inclined portion configured to direct flow of the heat transfer medium towards the protruding portion is formed in the heat-transfer-medium circulating path.

5. A vehicle air conditioning apparatus comprising:
a blower that circulates outside air or vehicle cabin air;
a cooler provided at the downstream side of the blower; and
a radiator provided at the downstream side of the cooler, wherein
a heat-transfer-medium heating apparatus according to claim 1 is used to heat a heat transfer medium to be circulated through said radiator.

* * * * *